United States Patent
Song et al.

(10) Patent No.: US 7,309,924 B2
(45) Date of Patent: Dec. 18, 2007

(54) UBM FOR FINE PITCH SOLDER BALL AND FLIP-CHIP PACKAGING METHOD USING THE SAME

(75) Inventors: Hoon Song, Seoul (KR); Dong-sik Shim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 302 days.

(21) Appl. No.: 11/012,294

(22) Filed: Dec. 16, 2004

(65) Prior Publication Data

US 2005/0151269 A1   Jul. 14, 2005

(30) Foreign Application Priority Data

Dec. 18, 2003   (KR) .................. 10-2003-0093209

(51) Int. Cl.
  *H01L 23/48*   (2006.01)
(52) U.S. Cl. ................. 257/778; 257/E23.069; 438/108; 438/613
(58) Field of Classification Search .......... 438/108, 438/109, 613, FOR. 343, 406, 455; 257/778, 257/673, 737, E21.503, E23.021, E23.069
  See application file for complete search history.

(56) References Cited

U.S. PATENT DOCUMENTS 5,903,058 A * 5/1999 Akram .................. 257/778

6,341,071 B1 * 1/2002 Johnson et al. ............. 361/767
2002/0070437 A1   6/2002 Herman

FOREIGN PATENT DOCUMENTS

| DE | 102 08 910 A1 | 9/2003 |
| DE | 102 23 203 A1 | 12/2003 |
| EP | 0 758 145 A | 2/1997 |
| JP | 2001-53111 A | 2/2001 |
| WO | WO 03/025974 A2 | 3/2003 |

* cited by examiner

*Primary Examiner*—Brook Kebede
*Assistant Examiner*—Khiem D Nguyen
(74) *Attorney, Agent, or Firm*—Sughrue Mion, Pllc.

(57) ABSTRACT

A flip-chip package for implementing a fine solder ball, and a flip-chip packaging method using the same. The flip-chip package includes a first wafer having a first electrode and a first under bump metal (UBM) formed on the first electrode and electrically connected to the first electrode; and second wafer opposing the first wafer and having a second electrode located in a position corresponding to the first electrode, and a second UBM formed on the second electrode and electrically connected to the second electrode. The first wafer has a depression formed on one or more areas adjacent to the first UBM, which depression partly receives a solder ball that connects the first and the second UBMs upon flip-chip bonding of the first and second wafers. Since the UBM is formed as an embossing pattern, a fine solder ball can be implemented. Additionally, the reliability of the package can be improved.

5 Claims, 6 Drawing Sheets

UBM FOR FINE PITCH SOLDER BALL AND FLIP-CHIP PACKAGING METHOD USING THE SAME

CROSS-REFERENCE TO RELATED APPLICATIONS

This application claims the benefit of Korean Application No. 2003-93209, filed Dec. 18, 2003, in the Korean Intellectual Property Office, the disclosure of which is incorporated herein by reference.

BACKGROUND OF THE INVENTION

1. Field of the Invention

The present invention relates to a semiconductor flip-chip package. More particularly, the present invention relates to an under bump metal (UBM) for implementing a fine pitch solder ball, and a flip-chip packaging method using the same.

2. Description of the Related Art

As the speed and integration of semiconductor chips has been improved, semiconductor chip elements have become finer, and the number of I/Os has increased. Methods for packaging a semiconductor chip in a minimum space, such as a ball grid array package and a chip scale package, have recently been introduced. The semiconductor chip is packaged using diverse electric connections such as wire bonding, tape automated bonding (TAB), and flip-chip bonding. Flip-chip bonding is most effective for a high-speed, intelligent and high-density package, in which an electrode arranged on the semiconductor chip and a wafer connection terminal are directly connected.

FIGS. 1A and 1B illustrate a package using conventional flip-chip bonding. Referring to FIG. 1A, solder bumps 31 and 32, as a connection medium, are deposited on a connection terminal (not shown) on a wafer 10. The solder bumps 31 and 32 take on the shape of a sphere by a reflow process, and a semiconductor chip pad 40 is bonded thereto to assume the shape 31a, 32a. The solder bumps 31 and 32 are hereinafter referred to as solder balls 31 and 32.

To enable the solder balls 31 and 32 to easily adhere to the semiconductor chip pad 40, under bump metal (UBM) 21, 22, 41 and 42 is formed on a bonding area between the wafer 10 and the semiconductor chip pad 40. The UBM 21, 22, 41 and 42 is formed by evaporation-depositing or etching a metal such as Cr, Au, Ti and Cu, so as to enhance wettability of the solder balls 31 and 32. The UBM also prevents diffusion of the solder so that the solder component cannot penetrate into the semiconductor chip.

As electronic products are miniaturized, more attention is being paid to package size. Therefore, fine pitch solder bumps have been developed. However, in forming fine pitch solder bumps, problems often occur in reliability of the package. Especially when the semiconductor chip pad 40 is bonded onto the solder balls 31 and 32, a shear stress is applied to the solder balls 31 and 32 by pressure from the wafer 10 and the pad 40, as shown in FIG. 2B. The pitch between solder balls 31 and 32 is determined according to the size of the solder balls, temperature, and force applied to the solder balls. In the prior art, the solder balls 31 and 32 are transversely deformed by the shear stress, thereby limiting the pitch between solder balls. As a result, a fine pitch pattern is hard to achieve.

SUMMARY OF THE INVENTION

The present invention was made with a view towards solving the above problems and/or disadvantages of the prior art, and to provide at least the advantages described below. Accordingly, an object of the present invention is to provide a fine pitch solder ball of high reliability by forming an under bump metal (UBM) as an embossing pattern rather than as a planar pattern, to thereby restrain diffusion or movement of the solder balls during bonding.

The above objects of the present invention have been achieved by providing a flip-chip package comprising: a first wafer having a first electrode and a first under bump metal (UBM) formed on the first electrode and electrically connected to the first electrode; and a second wafer having a second electrode corresponding to the first electrode, and a second UBM formed on the second electrode and electrically connected to the second electrode, and a solder ball connecting the first and second UBMs, wherein the first wafer comprises a depression formed on one or more areas adjacent to the first UBM which partly receives the solder ball connecting the first and the second UBMs upon flip-chip bonding of the first and second wafer.

In a preferred embodiment, the depression has a sidewall that is slanted by a predetermined angle, namely, the sidewall adjacent to the first UBM, and the first UBM extends to the sidewall of the depression adjacent to the first UBM.

The term "wafer" as used herein is intended to include any substrate or component suitable for flip-chip bonding, and without particular limitation.

In another preferred embodiment, the depression further comprises a third UBM separated from the first UBM by a predetermined distance, formed on the sidewall of the depression adjacent to the first UBM and which is electrically connected to the first electrode.

In a second aspect, the present invention provides a method of making flip-chip package using a UBM for implementing a fine solder ball, which comprises etching a first wafer to form thereon an inclining depression having a sidewall having a predetermined slant formed around a first area; forming a first metal film on the first wafer including the inclining depression; removing the first metal film formed on the first wafer except from the first area and the slanted sidewall adjacent the first area to form a first UBM which is to be electrically connected to an electrode of the first wafer; forming a conductive solder ball on the first UBM which is on the first area; depositing a conductive material on a second area of a second wafer corresponding to the first area to form a second UBM to be electrically connected to an electrode of the second wafer; and bonding the first wafer having the first UBM and the solder ball to the second wafer having the second UBM.

In a preferred embodiment, the step of forming a conductive solder ball comprises forming a photoresist film on the first wafer except for on the first area where the first UBM is formed; forming a second metal film on the first area where the first UBM is formed; removing the photoresist; and forming the solder ball by heating the second metal film at a predetermined temperature.

In another preferred embodiment, the step of forming a conductive solder ball comprises spoid-dropping a solder ball of predetermined temperature on the first area where the first UBM is formed.

In yet another preferred embodiment, the first metal film on the first area and the first metal film on the adjacent slanted sidewall are separated by a predetermined distance.

More preferably, the second wafer has a UBM pattern corresponding to a UBM pattern of the first wafer.

BRIEF DESCRIPTION OF THE DRAWINGS

The above aspect and other features of the present invention will become more apparent by the following detailed description of exemplary embodiments with reference to the attached drawings, in which.

DETAILED DESCRIPTION OF THE PREFERRED EMBODIMENTS

Hereinafter, an embodiment of the present invention will be described in further detail with reference to the accompanying drawing figures. However, the present invention should not be construed as being limited thereto.

Figure 1A:
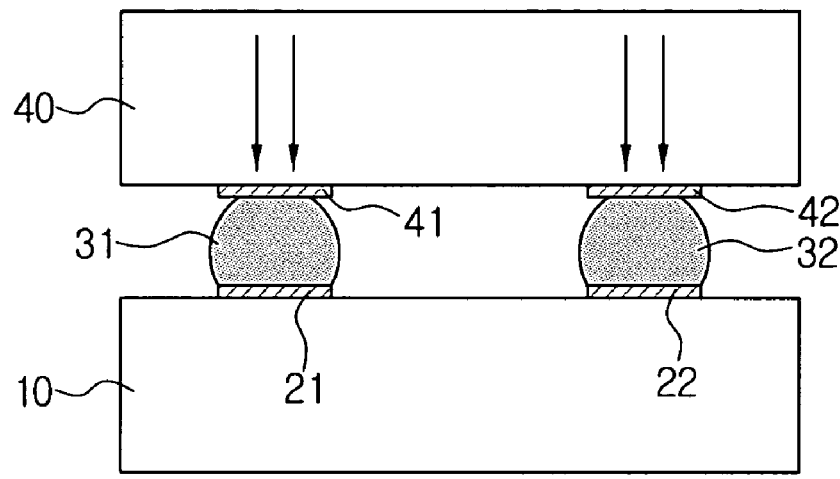
FIGS. 1A and 1B show a flip-chip package employing a conventional under bump metal (UBM)
Figure 1B:
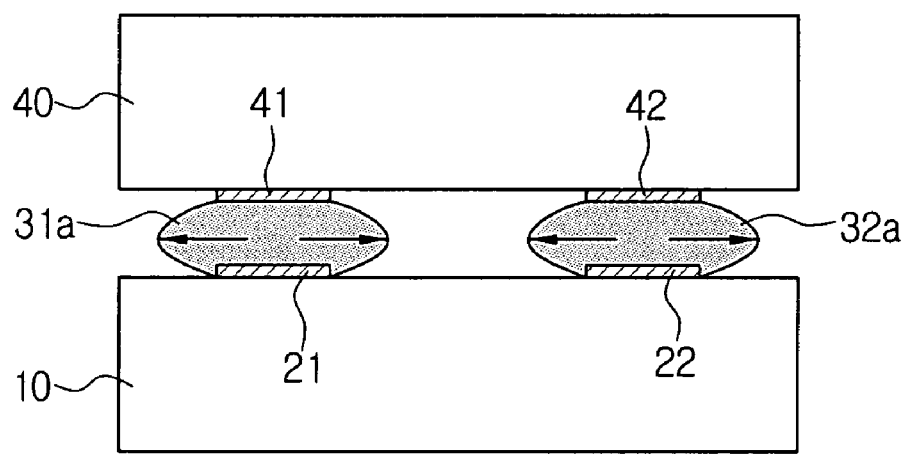
Figure 2A:
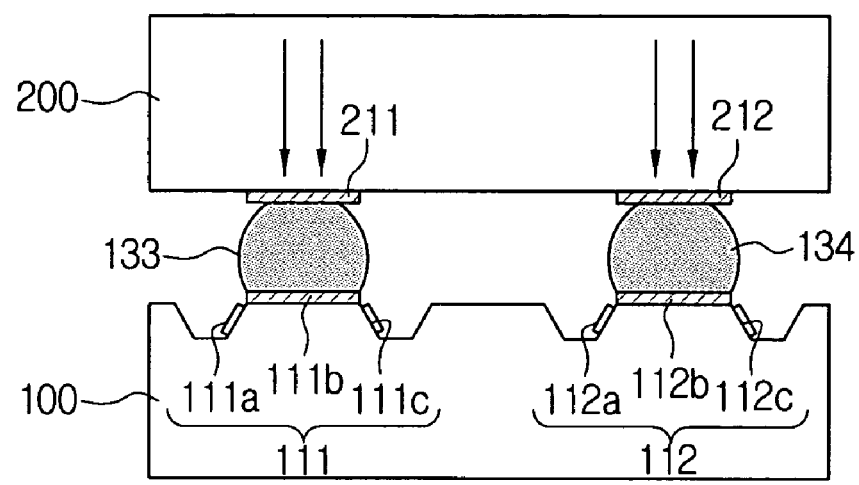
FIGS. 2A and 2B show a flip-chip package employing a UBM according to an embodiment of the present invention.
Figure 2B:
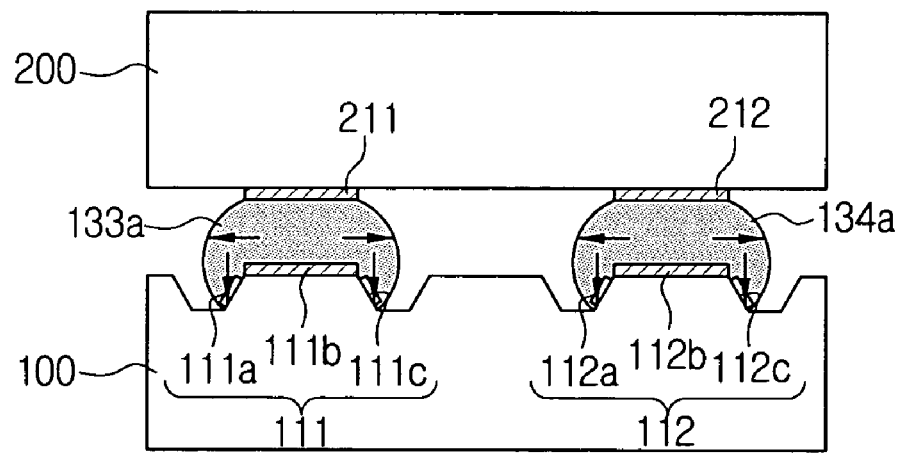

FIGS. 2A and 2B show a flip-chip package employing an under bump metal (UBM) according to one embodiment of the present invention. Referring to FIG. 2A, when joining a wafer 100 and a semiconductor chip pad 200 by a package bonding, solder balls 133 and 134 are used as a conjunction medium. The UBM 111, 112, 211 and 212 are disposed between the wafer 100 and the semiconductor chip pad 200 which will contact the solder balls 133 and 134, in order to enhance bonding of the wafer 100 and the semiconductor chip pad 200 and to restrain diffusion of the solder balls 133 and 134.

The UBM 111, 112, 211 and 212 are structured to have an embossing pattern to solve the problems of a conventional planar pattern. The UBM 111, 112, 211 and 212 formed on the wafer 100 are divided into first UBM 111b and 112b on the prominences of the wafer 100 where the solder balls 133 and 134 are to be disposed, and second UBM 111a, 111c, 112a and 112c on inclining sides of depressions formed in the wafer 100. The first and second UBMs are separated by a predetermined distance so that a portion of the wafer 100 therebetween can contact the solder balls 133a and 134a when the wafer 100 and the semiconductor chip pad 200 are bonded to each other.

The UBM 211 and 212 formed on opposing semiconductor chip pad 200 are disposed corresponding to the first UBM 111b and 112b. That is, chip pad 200 is flip-chip bonded to wafer 100 such that opposing UBM 211, 212 are aligned with UBM 111b, 112b, respectively.

When the semiconductor chip pad 200 is placed on the solder balls 133 and 134 which are maintained at a predetermined temperature, force is applied to the solder balls 133 and 134, thereby contacting the second UBM 111a, 111c, 112a and 112c as shown in FIG. 2B. The solder balls 133 and 134 are cooled in the state 133a, 134a as shown in FIG. 2B, so that the wafer 100 and the semiconductor chip pad 200 are bonded. The UBM 111 and 112 of the embossing pattern as described above disperse the force applied to the solder balls 133 and 134 to the side during bonding, toward the second UBM 111a, 111c, 112a and 112c. This prevents diffusion or movement of the solder balls 133 and 134, and also enables implementation of a fine solder ball. Furthermore, the material of the solder balls 133 and 134 is restrained from penetrating into neighboring elements, and therefore, the reliability of the package is improved.

The UBM 111, 121, 211 and 212 are made of Ni or Ni—Cu, and have a thickness of substantially 0.5~10 μm. At a lower part of the UBM 111, 121, 211 and 212, an adhesion layer made of Ti, Cr or TiW and having a thickness of substantially 0.5~10 μm, and an anti-oxidation layer made of Au, Pt, Pd or Cu and having a thickness of substantially 0.5~2 μm may be formed.

Figure 3:
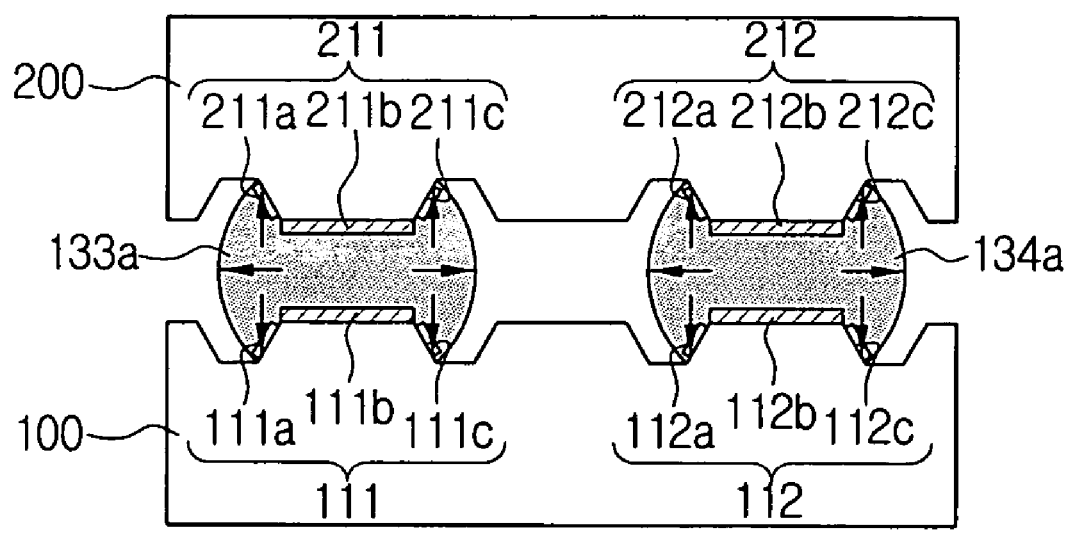
FIG. 3 shows a flip-chip package employing a UBM according to another embodiment of the present invention.

FIG. 3 shows a flip-chip employing a UBM according to another embodiment of the present invention. In this embodiment, the UBM 211 and 212 formed on the semiconductor chip pad 200 are constructed to have an embossing pattern as well as the UBM 111 and 112 formed on the wafer 100. As shown in FIG. 3, UBM 211 and 212 are divided into first UBM 211b and 212b on the prominences of the semiconductor chip pad 200 where the solder balls 133 and 134 are to be disposed, and second UBM 211a, 211c, 212a and 212c on inclining sides of depressions formed in the semiconductor chip pad 200.

Although an example in which the semiconductor chip pad 200 is bonded to the wafer 100 is described in this embodiment, the present invention should not be construed as being limited thereto. Accordingly, other various micro bonding processes can be applied.

FIGS. 4A to 4I are sectional views showing steps of processing the flip-chip package employing the UBM of FIG. 2B.

Figure 4A:
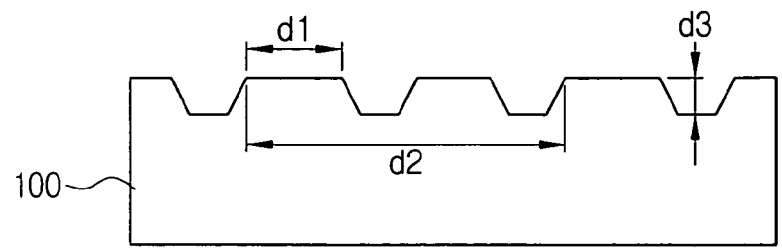
FIGS. 4A through 4I are sectional views showing processing steps for making the flip-chip package employing the UBM of FIG. 2B.

First, a pattern for solder bumps 131 and 132 is prepared, and a wafer 100 is etched according to a desired pattern. FIG. 4A shows the structure of the wafer 100 after etching. Wet or dry etching is performed on the wafer 100 around the area where the solder bumps 131 and 132 are to be formed, creating depressions by a predetermined depth $d_3$ and inclining approximately 54.7°. A distance $d_1$ denotes a length of a side of the solder bumps 131 and 132, and a distance $d_2$ denotes a pitch between the solder bumps 131 and 132. The distance $d_3$ is an etched depth of the wafer 100, which is determined by $d_1$, $d_2$ and the material of the solder bumps 131 and 132.

Figure 4B:
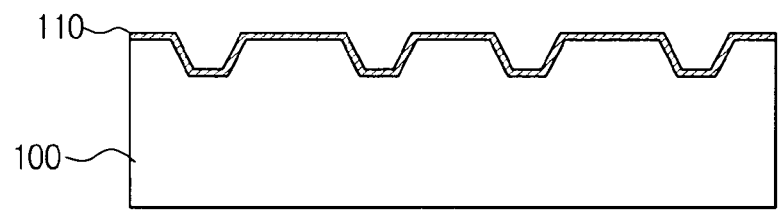

Next, a metal film 110 comprising Ni and Cu is deposited onto the wafer 100 to a thickness of approximately 0.5~10 μm, as shown in FIG. 4B.

Figure 4C:
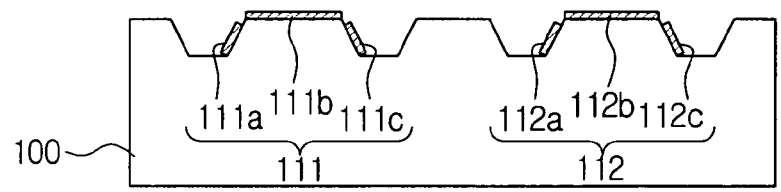

FIG. 4C shows a process of forming UBM 111 and 112 by etching the wafer 100 excluding: solder bump areas 111b and 112b on which the solder bumps 131 and 132 will be formed; and slanted sidewalls 111a, 111c, 112a and 112c of the inclining depressions, which are adjacent to the solder bump areas 111b and 112b. Boarders of the solder bump areas 111b and 112b and the slanted sidewalls 111a, 111c, 112a and 112c are also etched to remove the metal film thereon, so that a part of the solder bumps 131 and 132 can adhere to the wafer 100.

Figure 4D:
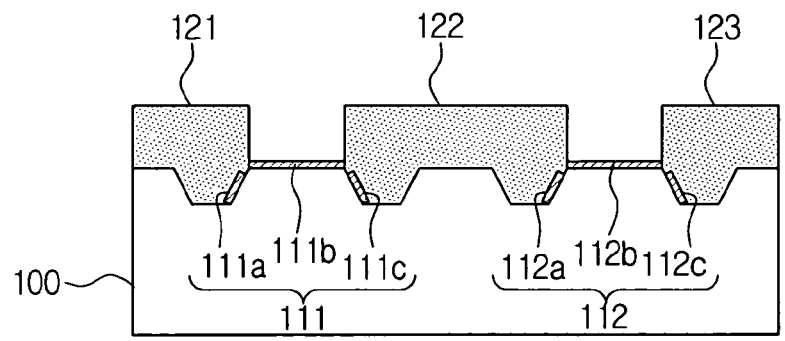

A photoresist film of a predetermined thickness is deposited on the wafer 100. The photoresist film on areas, except those areas where solder bumps 131 and 132 will be disposed, is removed by exposure and development, leaving photoresist film portions 121, 122, 123, as shown in FIG. 4D.

Figure 4E:
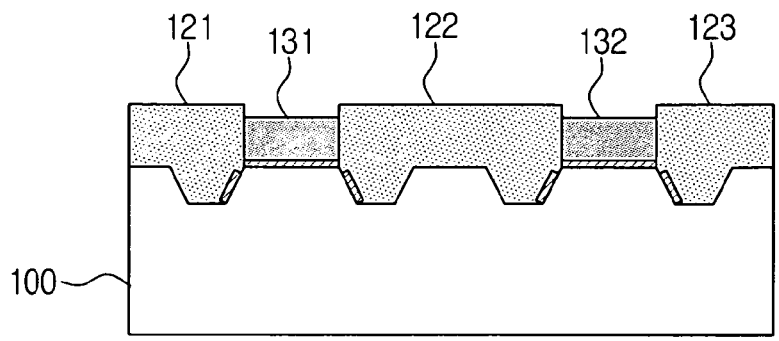
Figure 4F:
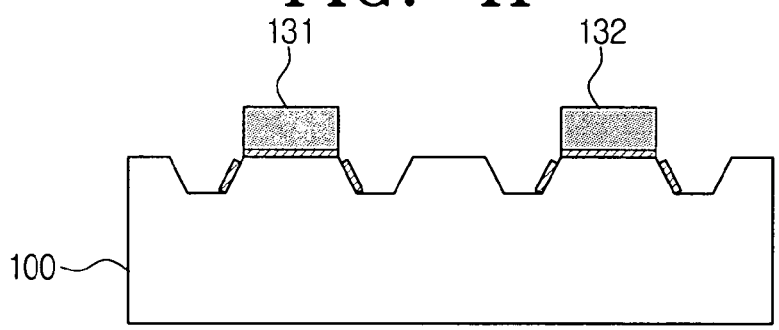

FIGS. 4E and 4F show a process in which the remaining photoresist film portions 121, 122 and 123 are removed after solder bumps 131, 132 are deposited. When the wafer 100 is made of ceramic, 95% Pb-5% Sn at a temperature of about 315° ($T_m$=315°) is generally used for the solder. When the wafer 100 is a printed circuit board (PCB), 37% Pb-63% Sn at a temperature about 183° ($T_m$=183°) is used for the solder. However, the material of the solder is not limited, and Pb—Sn, Au—Sn, Ag—Cu and other materials of different composition ratios can also be employed. The size of the solder bumps 131 and 132 is determined by the pitch of the solder.

Figure 4G:
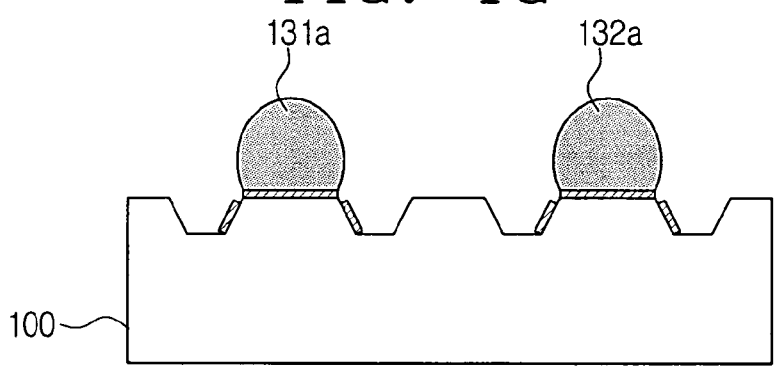

FIG. 4G shows a reflow process which applies a predetermined heat processing treatment to the solder bumps 131 and 132 in order to form solder balls 131a and 132a. To form the solder balls 131a and 132a, heat processing after plating can be used as above, however, a general method in which the solder balls are bonded is also applicable.

Figure 4H:
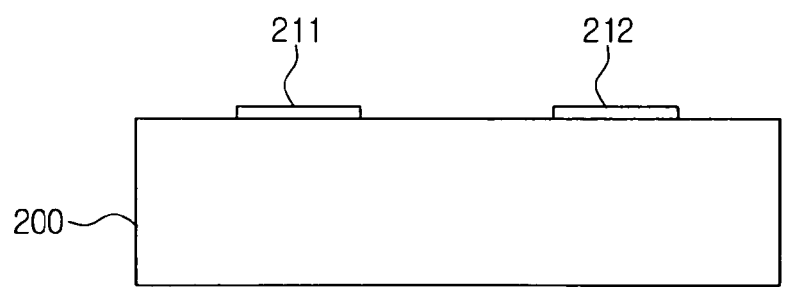
Figure 4I:
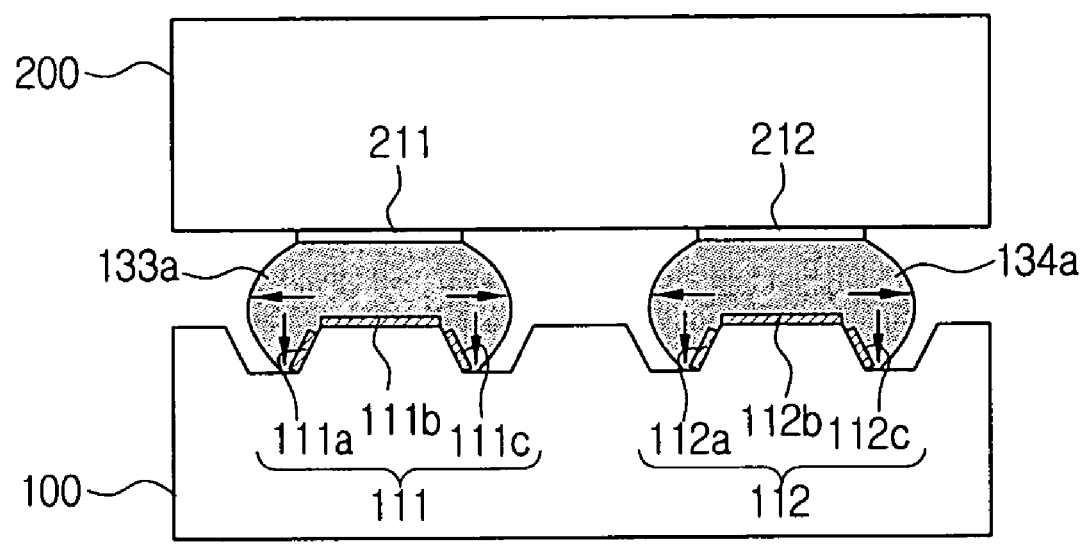

FIG. 4I shows a final step in which opposing semiconductor chip pad 200 is bonded onto the wafer 100 by aligning the corresponding bonding portions. Before bonding, the UBM 211 and 212 made of a metal film are formed on the bonding portion of the semiconductor chip pad 200 as shown in FIG. 4H. Due to pressure from the wafer 100 and the semiconductor chip pad 200, shear stress is applied to the solder balls 131a and 132a. As the solder balls 131a and 132a adhere to the UBM 111a, 111c, 112a and 112c formed on the sidewalls of the inclining depressions, the lateral force applied to the solder balls is dispersed to the sides where the UBM 111a, 111c, 112a and 112c are formed such that the solder balls assume the shape 133a, 134a. As a result, lateral diffusion of the solder balls 131a and 132a can be reduced. In addition, solder balls of a predetermined temperature can be spoid-dropped on the areas 111b and 112b where the UBM is formed.

As can be appreciated from the above description of the flip-chip package, a fine solder ball can be implemented, and the reliability of the package is improved by forming the UBM as an embossing pattern.

While the invention has been shown and described with reference to certain embodiments thereof, it will be understood by those skilled in the art that various changes in form and detail may be made therein without departing from the spirit and scope of the invention as defined by the appended claims.

What is claimed is:

1. A flip-chip package comprising:
a first wafer having a first electrode and a first under bump metal (UBM) formed on the first electrode and electrically connected to the first electrode;
a second wafer opposing said first wafer and having a second electrode aligned with the first electrode, and a second UBM formed on the second electrode and electrically connected to the second electrode; and
a solder ball connecting the first and second UBMs,
wherein the first wafer comprises a depression formed on one or more areas adjacent to the first UBM, which depression partly receives the solder ball connecting the first and the second UBMs upon flip-chip bonding of the first and second wafers,
wherein the depression has a sidewall adjacent to the first UBM that is slanted by a predetermined angle, and
wherein the first UBM extends to said sidewall;
further comprising a third UBM separated from the first UBM by a predetermined distance, said third UBM being formed on said sidewall and being electrically connected to the first electrode.

2. A flip-chip packaging method using an under bump metal (UBM) for implementing a fine solder ball, comprising the steps of:
etching a first wafer to form thereon an inclining depression having a sidewall having a predetermined slant formed adjacent to a first area;
forming a first metal film on the first wafer including the inclining depression;
removing the first metal film formed on the first wafer except from the first area and the slanted sidewall adjacent to the first area to form a first UBM to be electrically connected to an electrode of the first wafer, wherein the first metal film on the first area and the first metal film on the adjacent slanted sidewall are separated by a predetermined distance;
forming a conductive solder ball on the first UBM which is on the first area;
depositing a conductive material on a second area of an opposing second wafer corresponding to the first area to form a second UBM to be electrically connected to an electrode of the second wafer; and
bonding the first wafer having the first UBM and the solder ball to the second wafer having the second UBM.

3. The flip-chip packaging method as claimed in claim 2, wherein the step of forming a conductive solder ball comprises:
forming a photoresist film on the first wafer except for on the first area where the first UBM is formed;
forming a second metal film on the first area where the first UBM is formed;
removing the photoresist; and
forming the solder ball by heating the second metal film at a predetermined temperature.

4. The flip-chip packaging method as claimed in claim 2, which comprises dropping a solder ball of predetermined temperature on the first area where the first UBM is formed.

5. The flip-chip packaging method of claim 2, wherein the second wafer has a UBM pattern corresponding to a UBM pattern of the first wafer.

* * * * *